(12) United States Patent
Lee et al.

(10) Patent No.: US 9,755,626 B2
(45) Date of Patent: Sep. 5, 2017

(54) SEMICONDUCTOR INTEGRATED CIRCUIT DEVICE HAVING DELAY CIRCUIT

(71) Applicant: SK hynix Inc., Icheon-si, Gyeonggi-do (KR)

(72) Inventors: Sung Yub Lee, Icheon-si (KR); Jae Hoon Cha, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/060,938

(22) Filed: Mar. 4, 2016

(65) Prior Publication Data

US 2017/0155382 A1    Jun. 1, 2017

(30) Foreign Application Priority Data

Nov. 30, 2015  (KR) .......................... 10-2015-0168869

(51) Int. Cl.
*H03K 5/13*   (2014.01)
*G11C 7/12*   (2006.01)
*G11C 8/08*   (2006.01)
*H03K 5/00*   (2006.01)

(52) U.S. Cl.
CPC ............... *H03K 5/13* (2013.01); *G11C 7/12* (2013.01); *G11C 8/08* (2013.01); *H03K 2005/00019* (2013.01)

(58) Field of Classification Search
None
See application file for complete search history.

(56) References Cited

U.S. PATENT DOCUMENTS

| | | | | |
|---|---|---|---|---|
| 5,777,923 A | * | 7/1998 | Lee ........................ | H01L 27/115 257/E27.103 |
| 5,835,436 A | * | 11/1998 | Ooishi ..................... | G11C 7/10 365/222 |
| 6,167,528 A | * | 12/2000 | Arcoleo .................... | G06F 1/10 713/501 |

* cited by examiner

*Primary Examiner* — James G Norman
(74) *Attorney, Agent, or Firm* — William Park & Associates Ltd.

(57) ABSTRACT

A semiconductor integrated circuit device may include a first circuit, a second circuit, and a delay circuit. The first circuit may include an output node. The second circuit may include an output node. The delay circuit may be coupled between the output node of the first circuit and the output node of the second circuit to selectively delay an output signal from the first circuit and an output signal from the second circuit.

11 Claims, 8 Drawing Sheets

SEMICONDUCTOR INTEGRATED CIRCUIT DEVICE HAVING DELAY CIRCUIT

CROSS-REFERENCES TO RELATED APPLICATION

The present application claims priority under 35 U.S.C. §119(a) to Korean application number 10-2015-0168869 filed on Nov. 30, 2015, in the Korean Intellectual Property Office, which is incorporated herein by reference in its entirety.

BACKGROUND

1. Technical Field

Various embodiments generally relate to a semiconductor integrated circuit device, and more particularly to a semiconductor integrated circuit device with delay circuits.

2. Related Art

An electronic system may include a plurality of semiconductor devices including a semiconductor memory device which may be used as a data storage. For example, when a central processing unit (CPU) requests data stored in certain addresses, the semiconductor memory device may output the data from certain memory cells corresponding to the addresses. The semiconductor memory device may store data in certain memory cell.

The semiconductor memory device may include delay circuits to adjust timings for a signal transmission. The delay circuit may include an inverter chain or a plurality of resistors. The delay circuit may occupy a large area of the semiconductor memory device if the semiconductor memory device requires large signal delays.

The delay circuit may be formed in a cross region or an x-hole region having a relatively low integration density in a memory bank of the semiconductor memory device. However, as an integration density of the semiconductor memory device increases, it may be difficult to integrate a plurality of delay circuits in a region of the semiconductor memory device having a relatively high integration density.

SUMMARY

According to an embodiment, there may be provided a semiconductor integrated circuit device. The semiconductor integrated circuit device may include a first circuit unit, a second circuit unit and a delay circuit block. The first circuit unit may include an output node. The second circuit unit may include an output node. The delay circuit block may be coupled between the output node of the first circuit unit and the output node of the second circuit unit to selectively delay an output signal from the first circuit unit and an output signal from the second circuit unit.

According to an embodiment, there may be provided a semiconductor integrated circuit device. The semiconductor integrated circuit device may include a word line-controlling unit, an equalizing control unit and a delay circuit block. The word line-controlling unit may be configured to generate a word line control signal in response to an active signal. The equalizing control unit may be configured to generate a bit line equalizing signal in response to the active signal. The delay circuit block may be coupled between an output node of the word line-controlling unit and an output node of the equalizing control unit to delay any one of the word line control signal and the equalizing signal.

According to example embodiments, the at least two circuit blocks may commonly include one delay circuit block so that the semiconductor integrated circuit device may have improved area efficiency.

DETAILED DESCRIPTION

Figure 1:
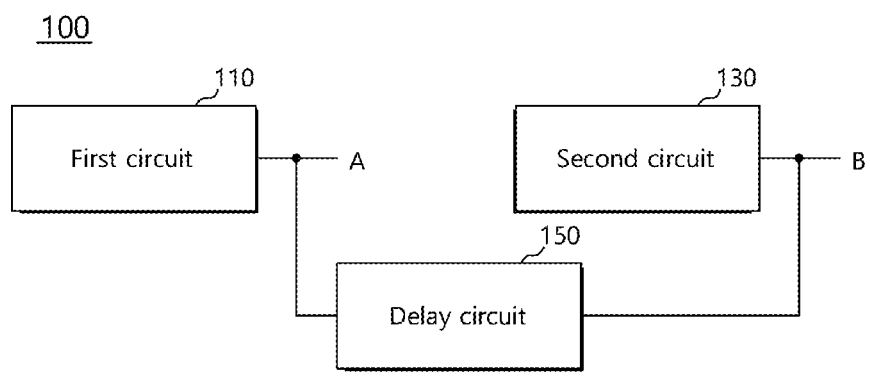
FIG. 1 is a diagram illustrating an example of a semiconductor integrated circuit device in accordance with example embodiments.

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey the scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of embodiments will be explained with reference to the accompanying drawings.

FIG. 1 is a diagram illustrating an example of a semiconductor integrated circuit device in accordance with example embodiments.

Referring to FIG. 1, a semiconductor integrated circuit device 100 in accordance with an example embodiment may include a first circuit 110, a second circuit 130, and a delay circuit 150. The first circuit 110 and the second circuit 130 may share the delay circuit 150.

Although FIG. 1 illustrates an example that includes two circuits sharing one delay circuit, the semiconductor integrated circuit device 100 in accordance with an example embodiment may include three or more circuits sharing one delay circuit. For example, the semiconductor integrated circuit device 100 in accordance with an example embodiment may include three or more circuits each having an output node, and a delay circuit becoming electrically coupled to one of the output nodes of the three or more circuits in response to a plurality of node selection signals. Voltage levels of the node selection signals may have a plurality of combinations. Each circuit of the three or more circuits may become electrically coupled to the delay circuit in response to one of the combinations.

Figure 2:
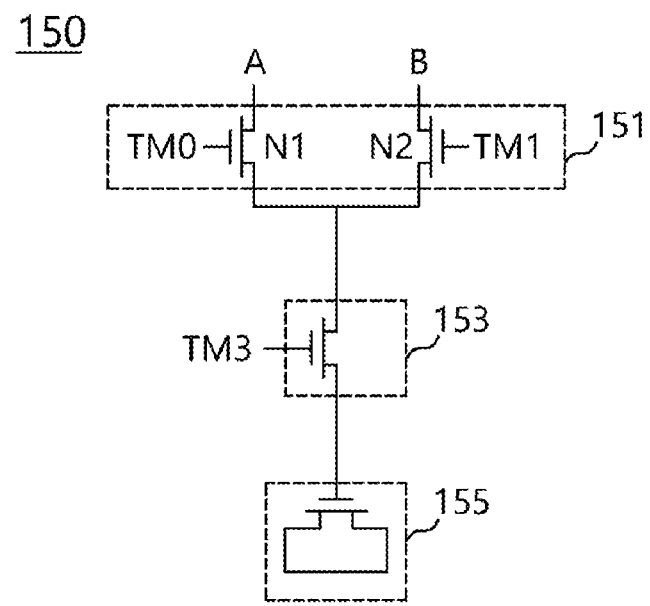
FIG. 2 is a diagram illustrating an example of a delay circuit in accordance with example embodiments.

FIG. 2 is a diagram illustrating an example of a delay circuit in accordance with example embodiments.

Referring to FIG. 2, the delay circuit 150 may include a selecting circuit 151, an enabling circuit 153 and a delaying circuit 155.

The selecting circuit 151 may include a first NMOS transistor N1 and a second NMOS transistor N2.

The first NMOS transistor N1 may include a gate, a drain, and a source. The gate of the first NMOS transistor N1 may receive a first node selection signal TM0. The drain of the first NMOS transistor N1 may be coupled to an output node A of the first circuit 110. The source of the first NMOS transistor N1 may be coupled to the enabling circuit 153. The first NMOS transistor N1 may operate as a switch and allow an output signal of the first circuit 110 to transition in response to the first node selection signal TM0.

The second NMOS transistor N2 may include a gate, a drain, and a source. The gate of the second NMOS transistor N2 may receive a second node selection signal TM1. The drain of the second NMOS transistor N2 may be coupled to an output node B of the second circuit 130. The source of the second NMOS transistor N2 may be coupled to the enabling circuit 153. The second NMOS transistor N2 may operate as a switch and allow an output signal of the second circuit 130 to transition in response to the second node selection signal TM1.

The enabling circuit 153 may include an NMOS transistor N3. The delaying circuit 155 may include a MOS capacitor.

The enabling circuit 153 may include a gate, a drain, and a source. The gate of the enabling circuit 153 may receive an enabling signal TM3. The drain of the enabling circuit 153 may be coupled to the selecting circuit 151. The source of the enabling circuit 153 may be coupled to the delaying circuit 155. The enabling circuit 153 may be driven in response to the enabling signal TM3.

Figure 3:
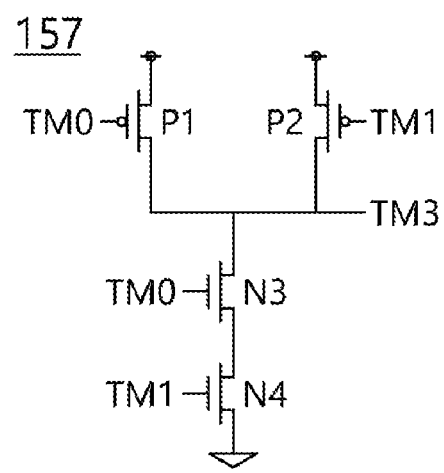
FIG. 3 is a diagram illustrating an example of an enable signal generating circuit in accordance with example embodiments.

Referring to FIG. 3, the enabling signal TM3 may be generated from an enable signal generation circuit 157. The enable signal generation circuit 157 may include a first PMOS transistor P1, a second PMOS transistor P2, a third NMOS transistor N3, and a fourth NMOS transistor N4.

The first PMOS transistor P1 may include a gate, a drain, and a source. The gate of the first PMOS transistor P1 may receive the first node selection signal TM0. The drain of the first PMOS transistor P1 may be coupled to a power voltage terminal. The source of the first PMOS transistor P1 may be coupled to an output node of the enabling signal TM3.

The second PMOS transistor P2 may include a gate, a drain, and a source. The gate of the second PMOS transistor P2 may receive the second node selection signal TM1. The drain of the second PMOS transistor P2 may be coupled to the power voltage terminal. The source of the second PMOS transistor P2 may be coupled to the output node of the enabling signal TM3.

The third NMOS transistor N3 may include a gate, a drain, and a source. The gate of the third NMOS transistor N3 may receive the first node selection signal TM0. The drain of the third NMOS transistor N3 may be coupled to the output node of the enabling signal TM3. The source of the third NMOS transistor N3 may be coupled to the fourth NMOS transistor N4.

The fourth NMOS transistor N4 may include a gate, a drain, and a source. The gate of the fourth NMOS transistor N4 may receive the second node selection signal TM1. The drain of the fourth NMOS transistor N4 may be coupled to the third NMOS transistor N3. The source of the fourth NMOS transistor N4 may be coupled to a ground voltage.

The first and second PMOS transistors P1 and P2 of the enabling circuit 153 may be coupled to the output node of the enabling signal TM3 in parallel. The third and fourth NMOS transistor N3 and N4 of the enabling circuit 153 may be coupled to the output node of the enabling signal TM3 in series. The enabling signal TM3 may be generated from connection nodes between the first and second PMOS transistor P1 and P2 and the third NMOS transistor N3.

|  | TM0 | TM1 | TM3 | Selection result |
| --- | --- | --- | --- | --- |
| Case 0 | 0 | 0 | 0 | X |
| Case 1 | 0 | 1 | 1 | Signal delay of first circuit |
| Case 2 | 1 | 0 | 1 | Signal delay of second circuit |
| Case3 | 1 | 1 | 0 | X |

As shown in the above table, the delay circuit 150 may be enabled in response to the first and second node selection signals TM0 and TM1. Thus, one delay circuit (e.g., the delay circuit 150) may be selectively driven to selectively delay output signals from the at least two circuits (e.g., first and second circuits 110 and 130). Further, the enabling circuit 153 may include an exclusive OR gate.

In an embodiment, if the delay circuit is coupled to only two circuits in common, the selection signals may be two complementary selection signals each electrically connecting the delay circuit to each of the two circuits, and thus the delay circuit may be selected by the two circuits without the enabling circuit 153.

Figure 4:
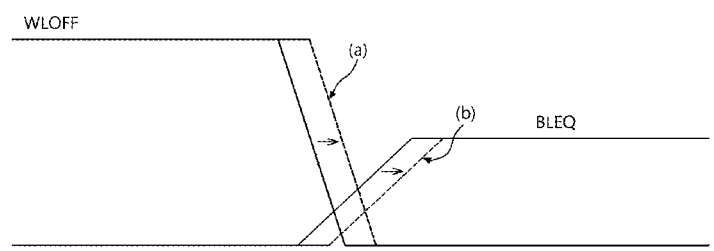
FIG. 4 is a waveform diagram illustrating examples of a word line control signal and an equalizing signal of a semiconductor integrated circuit device in accordance with example embodiments.

Referring to FIG. 4, when sensing data of a memory device, a word line control signal WLOFF may be disabled, and an equalizing signal BLEQ may be generated to pre-charge a bit line. An interval between a falling edge "a" of the word line control signal WLOFF and a rising edge "b" of the equalizing signal BLEQ may be shorter than a set time or greatly changed due to various process parameters. In these cases, the falling edge "a" of the word line control signal WLOFF or the rising edge "b" of the equalizing signal BLEQ may be delayed to ensure a set time margin.

Figure 5:
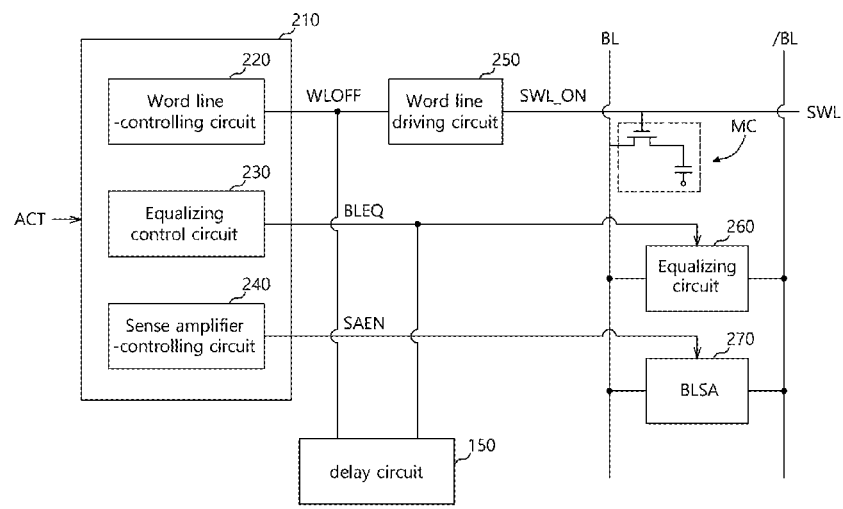
FIG. 5 is a diagram illustrating an example of a semiconductor integrated circuit device in accordance with example embodiments.

Referring to FIG. 5, in order to selectively delay the falling edge of the word line control signal WLOFF and the rising edge of the equalizing signal BLEQ, the delay circuit 150 may be coupled between an output node A of a word line controlling circuit 220 and an output node B of an equalizing control circuit 230 in an active controller 210.

A semiconductor integrated circuit device 200 may include a memory cell MC, the active controller 210, a word line driving circuit 250, an equalizing circuit 260 and a bit line sense amplifier BLSA 270.

The memory cell MC may be coupled between a word line SWL and a bit line BL to store data when the word line SWL is selected. The memory cell mc may include a MOS transistor and a capacitor.

The active controller 210 may generate the word line control signal WLOFF, the equalizing signal BLEQ, and a sense amplifier control signal SAEN in response to an active signal ACT. The active controller 210 may include the word line controlling circuit 220, the equalizing control circuit 230, and the sense amplifier controlling circuit 240.

The word line-controlling circuit 220 may activate the word line SWL to perform a charge-sharing operation between a pair of bit lines BL and /BL and the memory cell MC. The word line control signal WLOFF may be generated in response to an activation edge of the active signal ACT. The word line controlling circuit 220 may delay the active signal ACT to generate the word line control signal WLOFF.

The equalizing control 230 may delay the active signal ACT to generate the equalizing signal BLEQ. When the active signal ACT is disabled (e.g., when the active signal ACT is in a pre-charge mode), the equalizing control circuit 230 may equalize the bit lines BL and /BL to a predetermined voltage in response to the equalizing signal BLEQ.

The sense amplifier controlling circuit 240 may generate the sense amplifier control signal SAEN in response to the active signal ACT. Because the sense amplifier control signal SAEN may be generated in response to the activation edge of the active signal ACT, the sense amplifier controlling circuit 240 may be driven in response to the active signal ACT enabled.

The word line driving circuit 250 may receive the word line control signal WLOFF. The word line-driving circuit 250 may generate a signal SWL_ON for driving the word line SWL.

The equalizing circuit 260 may receive the equalizing signal BLEQ for equalizing the bit lines BL and /BL so that the equalizing control circuit 260 may be driven when the word line SWL is not in an active state (e.g., when the word line SWL is in the pre-charge mode).

The sense amplifier control signal SAEN may be provided to the bit line sense amplifier BLSA 270, which may sense and amplify voltages of the bit lines BL and /BL, to selectively drive the bit line sense amplifier 270.

In response to the active signal ACT, the semiconductor integrated circuit device 200 may determine, between the active mode and the pre-charge mode, the mode to enter. When the active signal ACT is in an active state, the semiconductor integrated circuit device 200 may be in the active mode. In contrast, when the active signal ACT is in an inactive state, the semiconductor integrated circuit device 200 may be in the pre-charge mode.

In example embodiments, the delay circuit 150 may be arranged between the output node of the word line controlling circuit 220 and the output node of the equalizing control circuit 230 to correct a time difference between the active mode and the pre-charge mode (e.g., between a time for enabling the word line and a time for equalizing of the bit lines). The delay time circuit 150 may have a structure substantially the same as that of the delay time circuit in FIG. 2. The output node "A" in FIG. 2 may correspond to the output node of the word line controlling circuit 220. The output node "B" in FIG. 2 may correspond to the output node of the equalizing control circuit 230.

Figure 6:
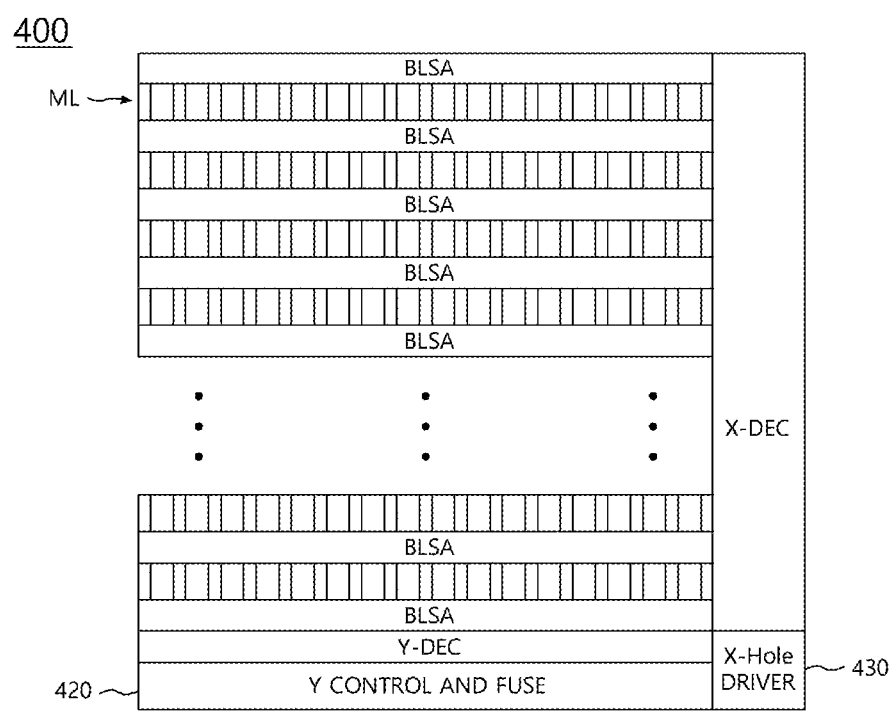
FIG. 6 is a plan view illustrating an example of a bank of a semiconductor integrated circuit device in accordance with example embodiments.

Referring to FIG. 6, the delay time circuit 150 may be arranged in an x-hole driver region 430. A bank 400 of a semiconductor memory device may include a MAT layer ML and a bit line sense amplifier array BLSA. The MAT layer ML may include a plurality of cell arrays. The MAT layer ML and the bit line sense amplifier array BLSA may extend in the same direction as one another, for example, an extending direction of the word line. The MAT layer ML and the bit line sense amplifier array BLSA may be alternately arranged in a space defined by the bank 400.

A row decoder X-DEC may be arranged outside one end of the MAT layer ML and the bit line sense amplifier array BLSA. Circuits for controlling row signals, for example, circuits for controlling the word line may be arranged in the row decoder X-DEC.

A column decoder Y-DEC and a column control circuit 420 may be arranged at outermost portion of the bit line sense amplifier array BLSA. The column decoder Y-DEC and the column control circuit 420 may extend in a direction the same or substantially the same as the extending direction of the MAT layer ML and the bit line sense amplifier array BLSA. Circuits for controlling column signals, for example, circuits for controlling the bit line may be arranged in the column decoder Y-DEC and the column control circuit 420.

The x-hole driver region 430 may be positioned at an intersection point of the row decoder X-DEC, the column decoder Y-DEC, and the column control circuit 420. The x-hole driver region 430 may have an integration density lower than that of other regions in the bank 400 so that the delay circuit 150 may be provided with a desired resistance.

Figure 7:
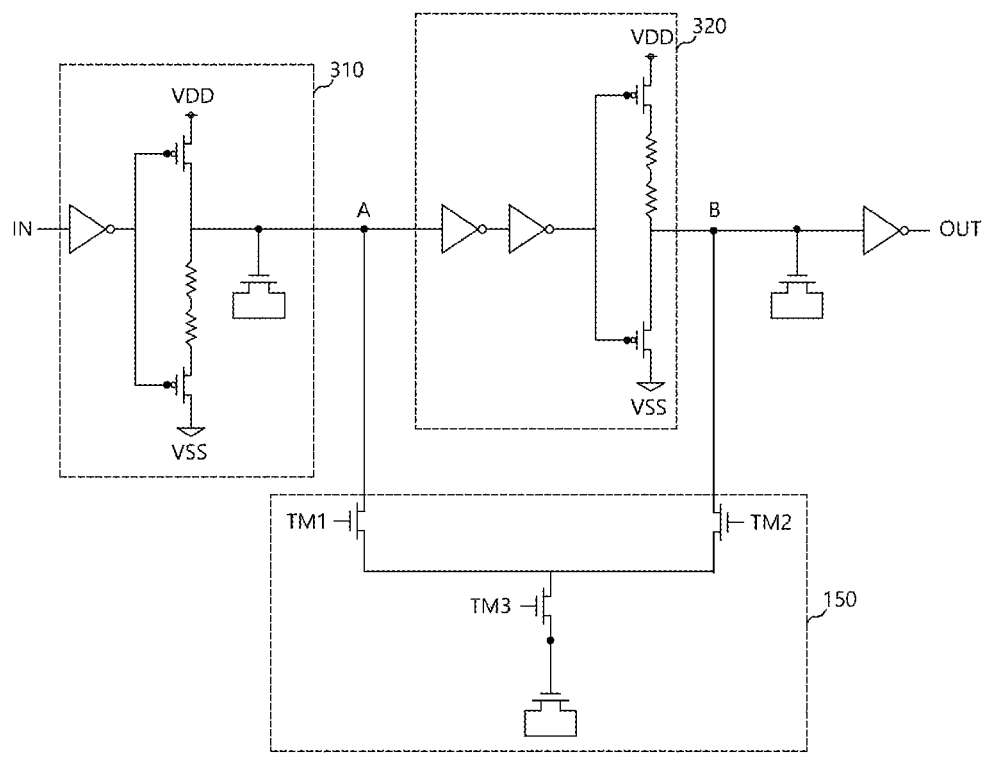
FIG. 7 is a diagram illustrating an example of a semiconductor integrated circuit device in accordance with example embodiments.

Referring to FIG. 7, the delay circuit 150 may be applied to a semiconductor integrated circuit device including an output node A of a first circuit 310 coupled to an input node of a second circuit 320.

The output node A of the first circuit 310 including various circuits may be coupled to the second circuit 320 including various circuits. The various circuits in the first circuit 310 and the second circuit 320 may include an inverter, a MOS transistor, a resistance, a MOS capacitor, etc.

The delay circuit 150 may be coupled between the output node A of the first circuit 310 and an output node B of the second circuit 320. The delay circuit 150 may delay an output signal output from the first circuit 310 or an output signal output from the second circuit 320 in accordance with voltage levels of the first node selection signal TM0 and the second node selection signal TM1.

According to example embodiments, one delay circuit may be shared by at least two circuits so that the semiconductor integrated circuit device may have improved area efficiency.

Figure 8:
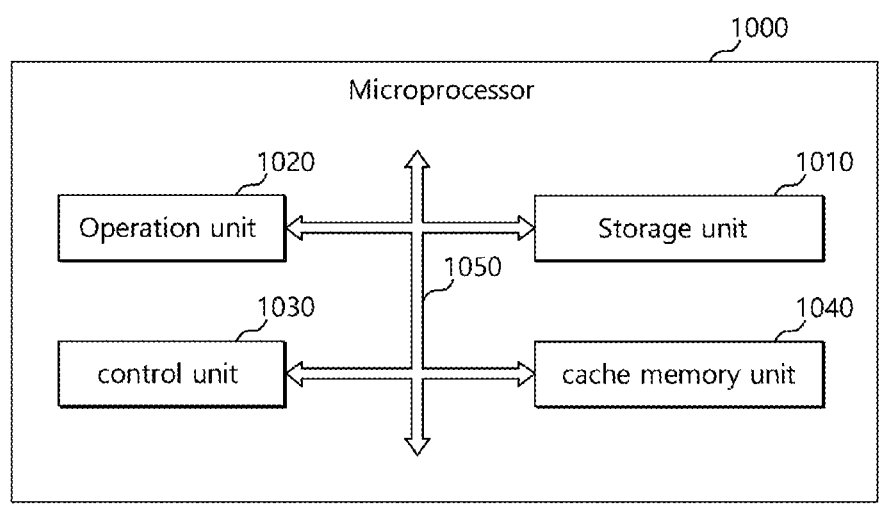
FIG. 8 is a diagram illustrating an example of a microprocessor according to an embodiment of the present disclosure.

As illustrated in FIG. 8, a microprocessor 1000 to which the semiconductor device according to the embodiment is applied may control and adjust a series of processes including receiving data from various external apparatuses, processing the data, and transmitting processing results to external apparatuses. The microprocessor 1000 may include a storage unit 1010, an operation unit 1020, and a control unit 1030. The microprocessor 1000 may include one or more of a variety of processing apparatuses, such as a micro processing unit (MPU), a central processing unit (CPU), a graphic processing unit (GPU), a digital signal processor (DSP), and an application processor (AP).

The storage unit 1010 may be a processor register or a register. The storage unit 1010 may be a unit that stores data in the microprocessor 1000 and may include a data register, an address register, and a floating point register. The storage unit 1010 may include various registers other than the above-described registers. The storage unit 1010 may temporarily store data to be processed in the operation unit 1020, resulting data that was processed in the operation unit 1020, and an address in which the data is stored.

The storage unit 1010 may include one or more of the semiconductor devices according to embodiments of the present invention. The semiconductor device of the storage unit 1010 may include a tunneling transistor, in which a semiconductor material layer having a low band gap is inserted into or around a source.

The operation unit 1020 may perform an operation in the microprocessor 1000 and perform fundamental arithmetic operations depending on a command of the control unit 1030. The operation unit 1020 may include one or more arithmetic and logic units (ALUs).

The control unit 1030 may receive a signal from the storage unit 1010, the operation unit 1020, or an external apparatus of the microprocessor 1000. The control unit 1030 may perform an extraction or decoding of a command and an input or output control, and may execute the command.

The microprocessor 1000 according to embodiments of the present invention may further include a cache memory unit 1040, which may temporarily store data input from an external apparatus or data to be output to an external apparatus. The cache memory unit 1040 may exchange data with the storage unit 1010, the operation unit 1020, and the control unit 1030 through a bus 1050.

Figure 9:
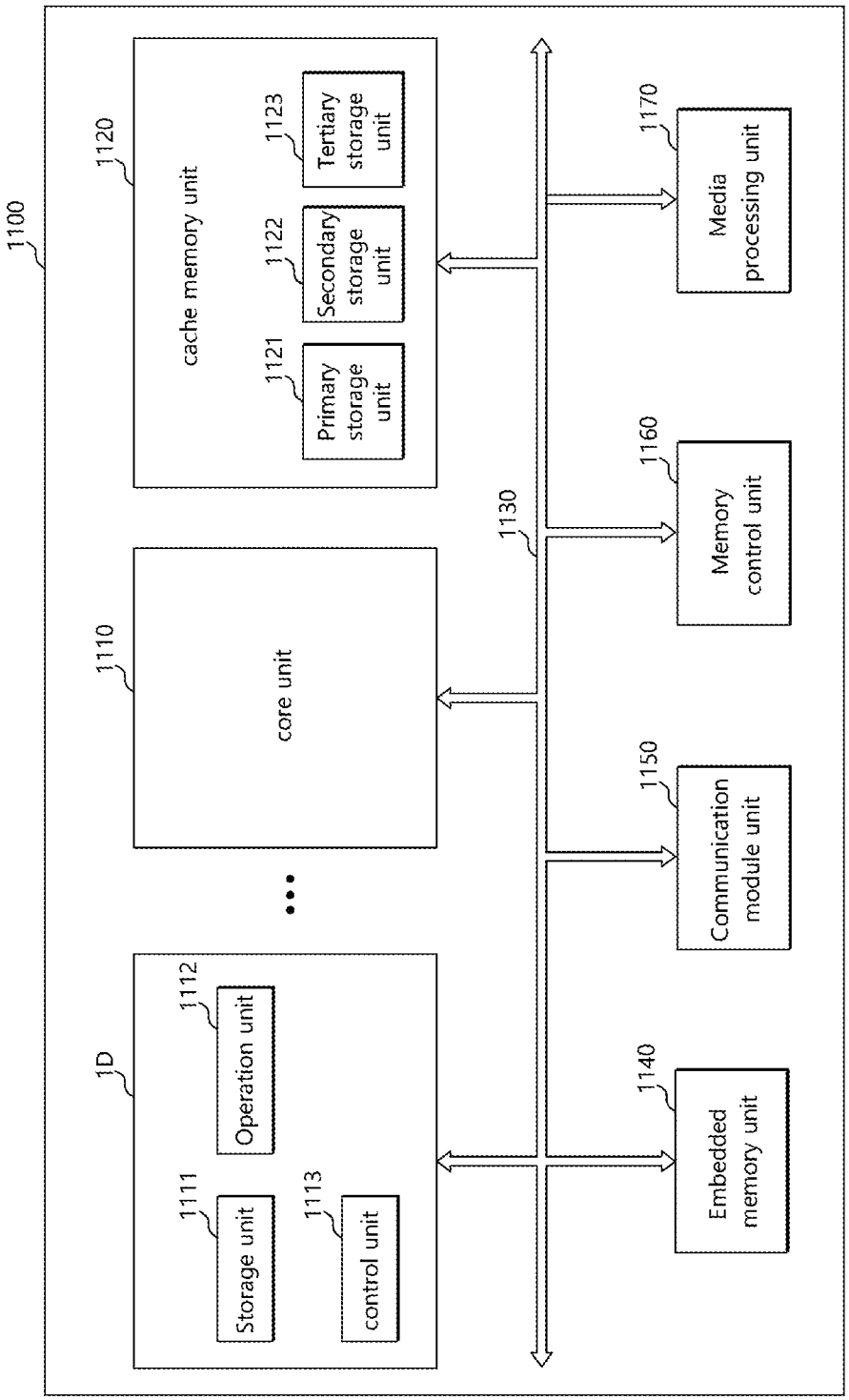
FIG. 9 is a diagram illustrating an example of a processor according to an embodiment of the present disclosure.

As illustrated in FIG. 9, a processor 1100 to which the semiconductor device according to an embodiment of the present invention is applied may include various functions to implement performance improvement and multifunction in addition to the functions of the microprocessor that may control and adjust a series of processes including receiving data from various external apparatuses, processing the data, and transmitting processing results to the external apparatuses. The processor 1100 may include a core unit 1110, a cache memory unit 1120, and a bus interface 1130. The core unit 1110 in accordance with an embodiment of the present invention may perform arithmetic and logic operations on data input from an external apparatus, and may include a storage unit 1111, an operation unit 1112, and a control unit 1113. The processor 1100 may be one of a variety of system on chips (SoCs) such as a multi core processor (MCP), a graphics processing unit (GPU), and an application processor (AP).

The storage unit 1111 may be a processor register or a register, and the storage unit 1111 may be a unit that may store data in the processor 1100 and include a data register, an address register, and a floating point register. The storage unit 1111 may include various registers. The storage unit 1111 may temporarily store data to be operated on in the operation unit 1112, resulting data that was processed in the operation unit 1112, and an address in which the data is stored.

The operation unit 1112 may be a unit that may perform an operation in the processor 1100 and perform a variety of fundamental arithmetic operation or logic operations depending on a decoding result of a command in the control unit 1113. The operation unit 1112 may include one or more arithmetic and logic units (ALUs). The control unit 1113 may receive a signal from the storage unit 1111, the operation unit 1112, or an external apparatus of the processor 1100, perform an extraction or decoding of a command, or an input or output control, and execute the command.

The cache memory unit 1120 may temporarily store data to improve the data processing rate of a low speed external apparatus. The cache memory unit 1120 may include a primary storage unit 1121, a secondary storage unit 1122, and a tertiary storage unit 1123. In general, the cache memory unit 1120 may include the primary and secondary storage units 1121 and 1122. When a high capacity storage unit is necessary, the cache memory unit 1120 may include the tertiary storage unit 1123. If necessary, the cache memory unit 1120 may include more storage units. That is, the number of storage units included in the cache memory unit 1120 may vary according to design.

Processing rates of the primary, secondary, and tertiary storage units 1121, 1122, and 1123 may be the same as or different from each other. When the processing rates of the storage units are different from each other, the processing rate of the primary storage unit may be set as the greatest.

One or more of the primary storage unit 1121, the secondary storage unit 1122, and the tertiary storage unit 1123 in the cache memory unit 1200 may include the semiconductor device according to an embodiment of the present invention. The cache memory unit 1120 including the semiconductor device according to embodiments may include a tunneling transistor, in which a semiconductor material layer having a low band gap is inserted into or around a source.

Further, FIG. 9 illustrates that all the primary, secondary, tertiary storage units 1121, 1122, and 1123 are disposed in the cache memory unit 1120. However, some or all of the primary, secondary, tertiary storage units 1121, 1122, and 1123 in the cache memory unit 1120 may be disposed outside the core unit 1110, and may supplement the difference between the processing rates of the core unit 1110 and an external apparatus. Further, the primary storage unit 1121 of the cache memory unit 1120 may be located in the core unit 1110, and the secondary storage unit 1122 and the tertiary storage unit 1123 may be located outside the core unit 1110 to further supplement the processing rate.

The bus interface 1130 may couple the core unit 1110 and the cache memory unit 1120 to efficiently transmit data.

The processor 1100 according to embodiments may include a plurality of core units 1110, and the core units 1110 may share the cache memory unit 1120. The core units 1110 and the cache memory unit 1120 may be coupled to one another through the bus interface 1130. The core units 1110 may have the same configuration as the above-described core unit 1110. When the core units 1110 are provided, the primary storage unit 1121 of the cache memory unit 1120 may be disposed in each of the core units 1110 corresponding to the number of core units 1110, and one secondary storage unit 1122 and one tertiary storage unit 1123 may be disposed outside the core units 1110 so that the core units share the secondary and tertiary storage units through the bus interface 1130. The processing rate of the primary storage unit 1121 may be greater than those of the secondary and tertiary storage units 1122 and 1123.

The processor 1100 according to embodiments may further include an embedded memory unit 1140, which may store data, a communication module unit 1150m which may transmit and receive data to and from an external apparatus in a wired or a wireless manner, a memory control unit 1160, which may drive an external storage device, and a media processing unit 1170, which may process data processed in the processor 1100 or data input from an external input device and may output a processing result to an external interface device. The processor may further include a plurality of modules in addition to the above-described components. The additional modules may transmit data to and receive data from the core unit 1110 and the cache memory unit 1120, and may transmit and receive data therebetween through the bus interface 1130.

The embedded memory unit 1140 may include one or more volatile memories as well as one or more nonvolatile memories. The volatile memory may include a dynamic random access memory (DRAM), a mobile DRAM, a static RAM (SRAM), or the like. The nonvolatile memory may include a read only memory (ROM), a NOR flash memory, a NAND flash memory, a phase-change RAM (PCRAM), a resistive RAM (RRAM), a spin transfer torque RAM (STTRAM), a magnetic RAM (MRAM), or the like. The semiconductor device according to embodiments may also be applied to the embedded memory unit 1140.

The communication module unit 1150 may include a module coupled to a wired network and a module coupled to a wireless network. The wired network module may include a local area network (LAN), a universal serial bus (USB), Ethernet, power line communication (PLC), or the like. The wireless network module may include Infrared Data Association (IrDA), Code Division Multiple Access (CDMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or the like.

The memory control unit 1160 may manage a data transmission between the processor 1100 and an external storage apparatus that may operate according to a different communication standard from the processor 1100. The memory control unit 1160 may include a variety of memory controllers or a controller that may control Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCMCIA), a USB, a secure digital (SD) card, a mini secure digital (mSD) card, a micro SD card, a secure digital high capacity (SDHC) card, a memory stick card, a smart media (SM) card, a multimedia card (MMC), an embedded MMC (eMMC), a compact flash (CF) card, or the like.

The media processing unit 1170 may process data processed in the processor 1100 or data input from an external input device, and may output a processing result to an external interface device so that the processing result may reproduce video, sound, etc. The media processing unit 1170 may include a GPU, a DSP, HD audio, a high definition multimedia interface (HDMI) controller, or the like.

Figure 10:
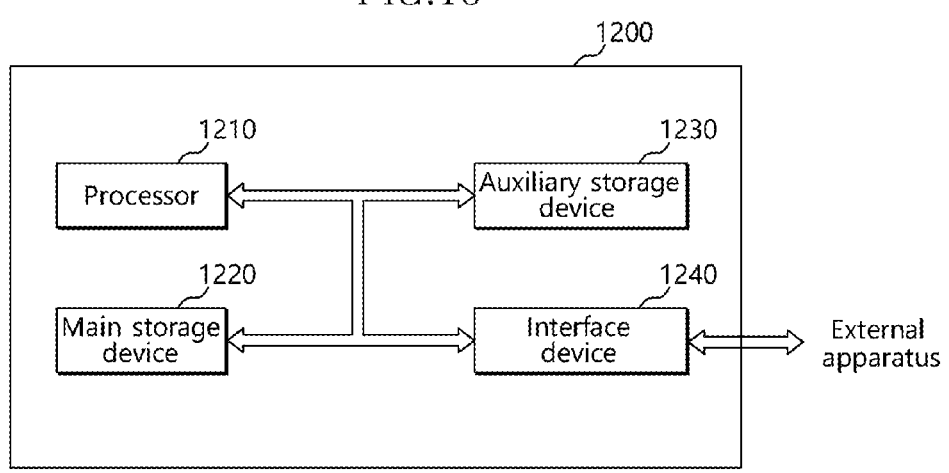
FIG. 10 is a diagram illustrating an example of a system according to an embodiment of the present disclosure.

As illustrated in FIG. 10, a system 1200 to which the semiconductor device according to an embodiment of the present invention is applied may be a data processing apparatus. The system 1200 may perform input, processing, output, communication, storage, and the like to perform a series of operations on data, and may include a processor 1210, a main storage device 1220, an auxiliary storage device 1230, and an interface device 1240. The system according to embodiments may include a variety of electronic systems that may operate using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 may be a core configuration of the system that may decode an input command and perform an operation and comparison of data stored in the system, and may include a MPU, a CPU, a single/multi core processor, a GPU, an AP, a DSP, or the like.

The main storage device 1220 may receive a program or data from the auxiliary storage device 1230 and execute the program or the data. The main storage device 1220 may retain the stored data even when power is interrupted, and may include a semiconductor device according to embodiments. The main storage device 1220 may include a tunneling transistor, in which a semiconductor material layer having a low band gap is inserted into or around a source.

The main storage device 1220 according to an embodiment may further include an SRAM or a DRAM of a volatile memory type. Alternatively, the main storage device 1220 may not include a semiconductor device according to the embodiments but may include an SRAM or a DRAM of a volatile memory type.

The auxiliary storage device 1230 may store a program code or data. The auxiliary storage device 1230 may have a lower data processing rate than the main storage device 1220, but may store large amounts of data and include a semiconductor device according to embodiments. The auxiliary storage unit 1230 may also include a tunneling transistor, in which a semiconductor material layer having a low band gap is inserted into or around a source.

The area of the auxiliary storage device 1230 according to embodiments of the present invention may be reduced, so that the overall size of the system 1200 may be reduced and portability of the system 1200 may increase. Further, the auxiliary storage device 1230 may further include a data storage system (not illustrated), such as a magnetic tape or a magnetic disc, a laser disc using light, a magneto-optical disc using magnetism and light, an SSD, a USB memory, a SD card, a mSD card, a micro SD card, a SDHC card, a memory stick card, a SM card, a MMC, an eMMC, or a CF card. Alternatively, the auxiliary storage device 1230 may not include a semiconductor device according to the above-described embodiments but may include a data storage system (not illustrated), such as a magnetic tape or a magnetic disc using a magnetism, a laser disc using light, a magneto-optical disc using magnetism and light, an SSD, a USB memory, a SD card, a mSD card, a micro SD card, a SDHC card, a memory stick card, a SM card, a MMC, an eMMC, or a CF card.

The interface device 1240 may exchange a command and data of an external apparatus with the system in accordance with an embodiment, and may be a keypad, a keyboard, a mouse, a speaker, a microphone, a display, a variety of Human Interface Devices (HIDs), or a communication device. The communication device may include multiple modules such as a module coupled to a wired network and a module coupled to a wireless network. The wired network module may include a LAN, a USB, Ethernet, PLC, or the like. The wireless network module may include IrDA, CDMA, TDMA, FDMA, a wireless LAN, Zigbee, a USN, Bluetooth, RFID, LTE, NFC, Wibro, HSDPA, WCDMA, UWB, or the like.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor integrated circuit device comprising:
a first circuit having an output node;
a second circuit having an output node; and
a delay circuit coupled between the output node of the first circuit and the output node of the second circuit to selectively delay one of an output signal of the first circuit and an output signal of the second circuit,
wherein the first circuit comprises a word line controlling circuit configured to generate a signal for activating a word line of a memory device, and
wherein the second circuit comprises an equalizing control circuit configured to generate a signal for equalizing a bit line of the memory device to a predetermined voltage.

2. The semiconductor integrated circuit device of claim 1, wherein the delay circuit comprises:
a selecting circuit configured to select one of the output signal of the first circuit and the output signal of the second circuit in response to a first node selection signal and a second node selection signal;
an enabling circuit coupled to the selecting circuit to determine operations of the delay circuit; and
a delaying unit coupled to the enabling circuit.

3. The semiconductor integrated circuit device of claim 2, wherein the selecting circuit comprises:
a first NMOS transistor coupled between the output node of the first circuit and the enabling circuit and driven in response to the first node selection signal; and
a second NMOS transistor coupled between the output node of the second circuit and the enabling circuit, the second NMOS transistor being driven in response to the second node selection signal,
wherein the first NMOS transistor receives the output signal of the first circuit, as a drain signal of the first NMOS transistor and the second NMOS transistor receives the output signal of the second circuit, as a drain signal of the second NMOS transistor.

4. The semiconductor integrated circuit device of claim 2, wherein the enabling circuit comprises an NMOS transistor driven in response to an enabling signal.

5. The semiconductor integrated circuit device of claim 4, wherein the enabling signal is activated when a voltage level of the first node selection signal is different from that of the second node selection signal, and the enabling signal is deactivated when the voltage level of the first node selection signal is the same as that of the second node selection signal.

6. The semiconductor integrated circuit device of claim 2, wherein the delaying unit comprises a MOS capacitor.

7. The semiconductor integrated circuit device of claim 1, wherein the delay circuit is positioned in an x-hole driver region of an intersection portion between a row decoder and a column decoder of the memory device.

8. The semiconductor integrated circuit device of claim 1, wherein the output signal of the first circuit is input into the second circuit, as an input signal of the second circuit.

9. A semiconductor integrated circuit device comprising:
a word line controlling circuit configured to generate a word line control signal for activating an word line in response to an active signal;
an equalizing control circuit configured to generate a bit line equalizing signal in response to the active signal; and
a delay circuit coupled between an output node of the word line controlling circuit and an output node of the equalizing control circuit, in common, and to selectively delay one of the word line control signal and the equalizing signal,
wherein the delay circuit comprises:
a selecting circuit configured to select one of the word line control signal and the bit line equalizing signal in accordance with a first node selection signal and a second node selection signal;
an enabling circuit coupled to the selecting circuit to determine operations of the delay circuit, the enabling circuit including an NMOS transistor driven in response to an enabling signal; and
a delaying unit coupled to the enabling circuit,
wherein the enabling signal is activated when a voltage level of the first node selection signal is different from that of the second node selection signal, and the enabling signal is deactivated when the voltage level of the first node selection signal is the same as that of the second node selection signal.

10. The semiconductor integrated circuit device of claim 9, wherein the selecting circuit comprises:

a first NMOS transistor coupled between the output node of the word line-controlling circuit and the enabling circuit and driven in response to the first node selection signal; and a second NMOS transistor coupled between the output node of the equalizing control circuit and the enabling circuit, the second NMOS transistor being driven in response to the second node selection signal, wherein the first NMOS transistor receives the word line control signal, as a drain signal of the first NMOS transistor and the second NMOS transistor receives the bit line equalizing signal, as a drain signal of the second NMOS transistor.

11. The semiconductor integrated circuit device of claim 9, wherein the delaying unit comprises a MOS capacitor.

* * * * *